United States Patent [19]

Glau

[11] Patent Number: 4,461,993

[45] Date of Patent: Jul. 24, 1984

[54] LOW RESISTANCE ELECTRICAL SPRING PROBE

[75] Inventor: Gordon L. Glau, West Covina, Calif.

[73] Assignee: Everett/Charles, Inc., Fontana, Calif.

[21] Appl. No.: 303,895

[22] Filed: Sep. 21, 1981

[51] Int. Cl.³ .................. G01R 1/06; G01R 31/02; H01H 1/06

[52] U.S. Cl. .................. 324/158 P; 324/72.5; 324/158 F; 339/108 TP; 339/255 R

[58] Field of Search .............. 324/72.5, 158 P, 158 F; 339/108 TP, 255 R

[56] References Cited

U.S. PATENT DOCUMENTS

| | | | |
|---|---|---|---|
| 3,435,168 | 3/1969 | Cooney | 324/158 P |
| 4,050,762 | 9/1977 | Hines et al. | 339/108 TP |
| 4,105,970 | 8/1978 | Katz | 324/158 P |
| 4,321,532 | 3/1982 | Luna | 324/158 P |

OTHER PUBLICATIONS

R. M. Morton, "High Performance AC Chip Contactor", *IBM Tech. Disc. Bulletin*, vol. 18, No. 3, Aug. 1975, pp. 749-750.

*Primary Examiner*—Stewart J. Levy
*Attorney, Agent, or Firm*—Christie, Parker & Hale

[57] ABSTRACT

An electrical probe having a spring loaded moving contact in which a compression spring and the inner end of the contact are confined within a tubular member. Low resistance is maintained between the moving contact and the tubular member by applying a lubricant to the coil spring. The lubricant is a synthetic grease having a synthetic oil base and a lithium hydroxy stearate mixed in the oil base. Because of the high viscosity and high shear strength of the lubricant, it prevents the buildup of particulate matter which tends to increase the resistivity of the sliding interface between the contact and the tubular member.

8 Claims, 1 Drawing Figure

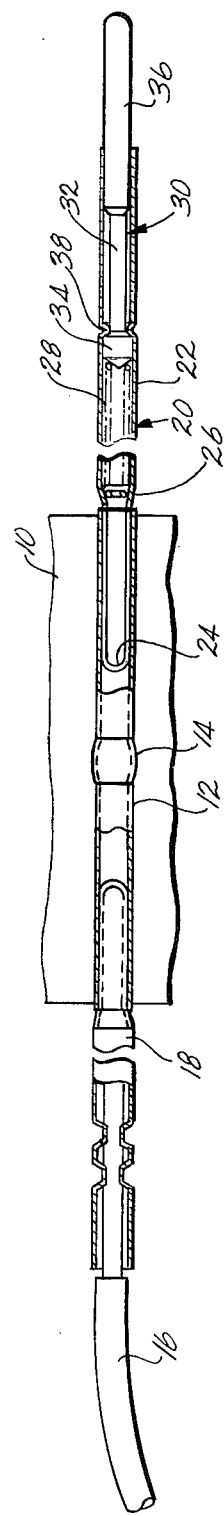

LOW RESISTANCE ELECTRICAL SPRING PROBE

BACKGROUND OF THE INVENTION

This invention relates to miniature telescoping spring loaded electrical probes for making electrical test connections to printed circuit boards and the like.

Electrical testing of printed circuit boards requires a large number of test connections to be made at closely spaced points on the circuit board. A matrix of closely spaced spring loaded probes projecting from an insulating board is used to make simultaneous contact with a large number of test points on the circuit board being tested. The individual probes have been constructed from an elongated conductive tubular housing with a conductive plunger telescoping inside the housing. The plunger has a contact surface projecting beyong the end of the tubular housing and a compression coil spring within the housing urges the plunger toward the end of the housing with the contact fully extended. The tubular housings of a number of probes are mounted on a common insulator base with the probes and contacts extending away from the base in closely spaced parallel relationship. By moving the base into proximity to a printed circuit under test, the probes can make simultaneous contact with a plurality of test points on the printed circuit board.

In order to make accurate and meaningful electrical measurements using the probes, it is essential that the electrical resistance introduced by the probe between the point of contact with the printed circuit board and a remote testing instrument not only be made as low as possible, but more importantly, that the resistance remain the same from one measurement to the next. In other words, the electrical resistance should remain substantially constant over the useful life of the probe, which may involve many hundreds of thousands of telescoping cycles.

In the past, performance of the probe assembly, and specifically, the resistance characteristics thorughout the life of the probe, has deteriorated due to friction particles formed by the sliding contact between the tubular housing or barrel and the plunger. The sliding action of the plunger tends to abrade the inside surface of the barrel generating particulate matter composed mostly of the base metal from which the barrel is constructed. This particulate matter is then trapped between the barrel and the plunger, the tiny particles acting to reduce the area of contact between the barrel and the plunger and causing an erratic and generally increasing level in electrical resistance during the life of the probe assembly. Also, the compression spring confined within the barrel tends to deflect laterally as it is compressed, creating a side load against the inside surface of the barrel. This side loading produces sliding contact between the coils of the spring and the inner surface of the barrel, again causing friction particles to be generated. The spring wire tends to wear due to sliding contact with the barrel, causing early fatigue failure of the compression spring.

SUMMARY OF THE INVENTION

The invention is directed to an improved probe having a greatly extended useful life during which electrical resistance is maintained at a substantially constant and very low level. The probe design provides for a replaceable contact assembly on as small as 1 millimeter centers. This is accomplished in brief by providing a spring contact electrical probe comprising a tubular barrel having a reduced diameter closed end portion adapted to plug into a female receptacle mounted in an insulator board. A plunger slides in the barrel and has a contact portion which projects out the opposite open end of the barrel. A coil compression spring urges the plunger outwardly against a stop so that pressure against the contact causes the plunger to retract into the barrel against the action of the coil spring. A diester synthetic grease containing a lithium hydroxy stearate mixed in a synthetic oil base is applied to the spring and acts not only to lubricate the wiping action of the spring and plunger on the inside of the barrel but also acts to entrap particles of abraded metal that otherwise tend to accumulate between the barrel and the plunger and produce erratic changes in electrical resistance of the probe. The lubricant also guards the spring and barrel against corrosion.

BRIEF DESCRIPTION OF THE DRAWING

For a better understanding of the invention, reference should be made to the accompanying drawing, wherein the single FIGURE is a side elevational view partly in section of the probe assembly.

DETAILED DESCRIPTION

Referring to the drawing in detail, the numeral 10 indicates generally a board or plate made of insulating material which is used as part of a test fixture for supporting a matrix of test probes used in testing a printed circuit board or the like. Each probe assembly includes a metallic receptacle 12 which is tubular in form and open at both ends. The center of the receptacle is enlarged slightly as indicated at 14 to ensure a press fit when inserted into a hole drilled in the insulating plate 10. Electrical connection to the receptacle may be provided through a wire 16 having a male plug or pin contact 18 crimped or otherwise secured to the end of the wire and pluggable into one end of the receptacle 12. The plug terminal is optional and the wire may be directly soldered or otherwise secured in the receptacle 12.

The removable probes assembly, indicated generally at 20, includes a barrel 22 which is tubular in shape. The barrel is preferably drawn from a piece of flat metallic stock so as to be closed at one end, as indicated at 24. By making the probe barrel by a drawing process, the interior surface may be preplated with gold to a uniform thickness while the barrel is in a flat undrawn form. This produces a much thicker and more uniform gold plated surface than could be achieved by attempting to plate the interior of the barrel after it is in finished form.

The barrel 22 adjacent the closed end 24 is drawn to a smaller diameter to form a tapered shoulder 26. The reduced diameter portion forms a plug which can be inserted into the receptacle 12, allowing the probe assembly to be removably mounted on the insulator plate 10.

A compression type coil spring 28 is inserted into the barrel with one end of the spring engaging the tapered shoulder 26, thus preventing the spring from extending into the plug end of the barrel where it might become pinched or restricted due to distortion or deformation of the plug end when inserted into the receptacle 12. A plunger, indicated generally at 30, is then inserted into the open end of the barrel. The plunger has a diameter which forms a sliding contact with the interior surface of the barrel so as to be freely movable while yet providing good electrical conductivity between the gold plated interior surface of the barrel and the plunger. The plunger has a reduced diameter portion 32 that divides the plunger into a head 34 which engages the end of the coil spring 28 and a contact portion 36 which projects beyond the end of the barrel. After assembly, the barrel is crimped, as indicated at 38, into the reduced diameter portion 32. The crimped portion provides a stop against which the head 34 of the plunger rests when the plunger is in its fully extended position under the action of the spring 28. The stop formed by the crimping 38 also limits the inward movement of the plunger against the spring.

A significant feature of the present invention is that prior to the assembly, the spring 28 is first immersed in a diester lubricant sold commercially as "Royco 27A" and "Royco 80827" aircraft grease. This grease, which is a proprietary product of Royal Lubricants Company of East Hanover, N.J., is made form a mixture of synthetic oils, a lithium hydroxy stearate and other unidentified additives which are said to impart resistance to oxidation and moisture, and to improve load carrying capacity under extreme pressures. Important characteristics of this material in terms of the present invention are its very high shear strength, high viscosity and non-hygroscopic characteristic, and does not form friction polymers.

After the spring is dipped in this lubricant, it is spun in a centrifuge to remove any excess lubricant material, leaving the spring coated with a thin uniform film. After the spring is assembled in the probe, the lubricant is distributed throughout the inside of the barrel during the first few actuations of the plunger. Although the lubricant is not conductive, it does not degrade the electrical characteristics of the probe assembly itself. Unlike conventional lubricants, such as petroleum based oils, graphite, and silicon oils which were tested, this material, in extended life tests of over a million cycles of retraction of the plunger into the barrel, maintained a uniformly low resistance characteristic of the order of $20 \times 10^{-3}$ ohms. This is in contrast to prior art probes available on the market which either failed or showed unacceptably high, and more importantly, highly erratic resistance characteristics in less than 200,000 cycles of operation.

What is claimed is:

1. A spring contact electrical probe comprising a tubular member, a plunger movable inside the tubular member and having a contact portion extending out of the open end of the tubular member, a compression coil spring inside the tubular member having one end engaging the head of the plunger and the other end engaging the tubular member, the spring urging the plunger head toward said opening, stop means limiting the outward movement of the plunger by the spring, and a synethetic grease applied to the spring for entrapping any particulate matter abraded from the tubular member by contact with the spring, said synthetic grease including a synthetic oil base and a lithium hydroxy stearate mixed in the oil base.

2. The apparatus of claim 1 wherein said synthetic grease is a non-hygroscopic and has a very high shear strength.

3. The apparatus of claim 1 in which the inside of the tubular member is gold plated.

4. The apparatus of claim 1 wherein the tubular member is reduced in diameter adjacent the end opposite the plunger to form a plug, the reduced diameter portion forming a shoulder which is engaged by one end of the spring.

5. A test probe device comprising an insulator board having a plurality of holes, a plurality of elongated tubular metal receptacles mounted in the respective holes, the receptacles being open on both sides of the board, a plurality of removable probe assemblies plugged into the receptacles, each probe assembly including a tubular member barrel having a reduced diameter portion adjacent one end adapted to telescope inside a receptacle as a plug, the length of the reduced diameter portion being less than half the lengths of the tubular receptacle, whereby the receptacle can receive another plug from the opposite end from the probe assembly, a compression spring inside the barrel, the reduced diameter plug portion forming a shoulder which is engaged by one end of a string, a plunger slidably positioned in the barrel against the other end of the spring for compressing the spring, the plunger forming a contact projecting out of the barrel, and a viscous liquid lubricant means evenly coating the spring, the lubricant means including a synthetic oil base and a lithium hydroxy stearate mixed in the oil base.

6. The apparatus of claim 5 wherein the lubricant means is non-hygroscopic and has a very high shear strength.

7. The apparatus of claim 5 wherein the lubricant means consists of an aircraft grease of a type sold commerically under the name "Royco 27A".

8. The apparatus of claim 5 wherein the lubricant means consists of an aircraft grease of a type sold commercially under the name "Royco 80827".

* * * * *